United States Patent
Jung et al.

(10) Patent No.: US 11,751,423 B2
(45) Date of Patent: Sep. 5, 2023

(54) DISPLAY APPARATUS INCLUDING HYDROPHOBIC BLOCKING LAYER ON THROUGH PORTION AND METHOD OF MANUFACTURING THE SAME

(71) Applicant: Samsung Display Co., Ltd., Yongin-si (KR)

(72) Inventors: Younjae Jung, Yongin-si (KR); Jongwoo Park, Yongin-si (KR); Taeyoung Kim, Yongin-si (KR); Heejin Kim, Yongin-si (KR); Youngtae Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 157 days.

(21) Appl. No.: 17/148,405

(22) Filed: Jan. 13, 2021

(65) Prior Publication Data

US 2021/0328184 A1    Oct. 21, 2021

(30) Foreign Application Priority Data

Apr. 21, 2020    (KR) ......................... 10-2020-0048303

(51) Int. Cl.
*H10K 50/844*    (2023.01)
*H10K 71/00*    (2023.01)
(Continued)

(52) U.S. Cl.
CPC .......... *H10K 50/844* (2023.02); *H10K 71/00* (2023.02); *H10K 77/10* (2023.02); *H10K 59/12* (2023.02); *H10K 59/1201* (2023.02)

(58) Field of Classification Search
CPC .......................... H01L 51/5253; H10K 50/844
See application file for complete search history.

(56) References Cited

U.S. PATENT DOCUMENTS 9,632,487 B2    4/2017 Kim et al.
9,997,738 B2    6/2018 Choi et al.
(Continued)

FOREIGN PATENT DOCUMENTS

JP    2018-87863 A    6/2018
KR    10-2017-0015632 A    2/2017
(Continued)

OTHER PUBLICATIONS

Pou, P., et al., "Laser texturing of stainless steel under different processing atmospheres: From superhydrophilic to superhydrophobic surfaces," Applied Surface Science, vol. 475, 2019, pp. 896-905.
(Continued)

*Primary Examiner* — Caleb E Henry
(74) *Attorney, Agent, or Firm* — Lewis Roca Rothgerber Christie LLP

(57) ABSTRACT

A display apparatus includes: a substrate including: a display area including a plurality of thin film transistors, and a plurality of display elements electrically connected to the plurality of thin film transistors; a first non-display area outside the display area; and a second non-display area at least partially surrounded by the display area; a through portion passing through the substrate in a vertical direction in the second non-display area; a metal layer surrounding the through portion at the second non-display area; and a hydrophobic blocking layer on an inner side surface of the through portion. The hydrophobic blocking layer includes an oxide of a metal material of the metal layer.

10 Claims, 10 Drawing Sheets

(51) Int. Cl.
    *H10K 77/10*    (2023.01)
    *H10K 59/12*    (2023.01)

(56) References Cited

U.S. PATENT DOCUMENTS

| | | | |
|---|---|---|---|
| 10,193,102 B2 | 1/2019 | Kanaya | |
| 10,499,476 B2 | 12/2019 | Kwon et al. | |
| 2017/0110532 A1* | 4/2017 | Kim | H01L 51/5256 |
| 2017/0148856 A1* | 5/2017 | Choi | H01L 27/3258 |
| 2017/0162637 A1* | 6/2017 | Choi | H01L 27/3276 |
| 2018/0151834 A1* | 5/2018 | Kanaya | H01L 51/504 |
| 2018/0159075 A1* | 6/2018 | Kim | H01L 27/1248 |
| 2019/0081273 A1 | 3/2019 | Sung et al. | |
| 2019/0212614 A1* | 7/2019 | Kwak | G02F 1/133514 |
| 2019/0334120 A1* | 10/2019 | Seo | G06F 3/0444 |
| 2020/0020752 A1* | 1/2020 | Shi | H04M 1/0266 |
| 2020/0064968 A1* | 2/2020 | Kim | G06F 3/0445 |
| 2020/0075692 A1* | 3/2020 | Park | H01L 27/3244 |
| 2020/0106046 A1* | 4/2020 | Kim | H01L 27/326 |
| 2020/0106057 A1* | 4/2020 | Yoo | G09G 3/3225 |
| 2020/0152842 A1* | 5/2020 | Park | H01L 27/15 |
| 2020/0168683 A1* | 5/2020 | Son | H01L 27/3258 |
| 2020/0176520 A1* | 6/2020 | Kim | H01L 51/5253 |
| 2020/0176708 A1* | 6/2020 | Kanaya | H01L 51/5237 |
| 2020/0194714 A1* | 6/2020 | Won | H01L 27/3248 |
| 2020/0194721 A1* | 6/2020 | Lee | G06F 3/0412 |
| 2020/0313101 A1 | 10/2020 | Jung et al. | |

FOREIGN PATENT DOCUMENTS

| | | |
|---|---|---|
| KR | 10-2017-0059537 A | 5/2017 |
| KR | 10-2018-0046960 A | 5/2018 |
| KR | 10-2019-0029830 A | 3/2019 |

OTHER PUBLICATIONS

Jagdheesh, R., et al., "One-Step Generation of Ultrahydrophobic Aluminum Surface Patterns by Nanosecond Lasers," Lasers in Manufacturing Conference 2015, 2015, 9 pages.

Long, Jiangyou, et al., "Formation mechanism of hierarchical Micro- and nanostructures on copper induced by low-cost nanosecond lasers," Applied Surface Science, vol. 464, 2019, pp. 412-421.

* cited by examiner

DISPLAY APPARATUS INCLUDING HYDROPHOBIC BLOCKING LAYER ON THROUGH PORTION AND METHOD OF MANUFACTURING THE SAME

CROSS-REFERENCE TO RELATED APPLICATION

This application claims priority to and the benefit of Korean Patent Application No. 10-2020-0048303, filed on Apr. 21, 2020, in the Korean Intellectual Property Office, the disclosure of which is incorporated herein in its entirety by reference.

BACKGROUND

1. Field

Aspects of or more example embodiments relate to a display apparatus and a method of manufacturing the same.

2. Description of Related Art

Recently, a physical button has been removed from the front surface of a display apparatus, and a display area on which an image is displayed has been gradually extended (e.g., enlarged or expanded). For example, to expand a display area, a display apparatus in which a separate member, such as a camera, for expanding the functions of the display apparatus and is arranged inside the display area has been introduced. To arrange a separate member such as a camera inside the display area, a groove or a through portion, and/or the like may be formed to locate the separate member inside the display area. However, the groove or the through portion formed inside the display area may serve as another moisture transmission path through which external moisture, and/or the like may penetrate into the display area.

The above information disclosed in this Background section is for enhancement of understanding of the background of the present disclosure, and therefore, it may contain information that does not constitute prior art

SUMMARY

One or more example embodiments of the present disclosure are directed to a display apparatus in which penetration of external moisture, and/or the like due to a through portion inside a display area is blocked or substantially blocked, and a method of manufacturing the display apparatus.

Additional aspects will be set forth in part in the description which follows and, in part, will be apparent from the description, or may be learned by practice of one or more of the presented embodiments of the present disclosure.

According to one or more embodiments of the present disclosure, a display apparatus includes: a substrate including: a display area including a plurality of thin film transistors, and a plurality of display elements electrically connected to the plurality of thin film transistors; a first non-display area outside the display area; and a second non-display area at least partially surrounded by the display area; a through portion passing through the substrate in a vertical direction in the second non-display area; a metal layer surrounding the through portion at the second non-display area; and a hydrophobic blocking layer on an inner side surface of the through portion. The hydrophobic blocking layer includes an oxide of a metal material of the metal layer.

In an example embodiment, the hydrophobic blocking layer may be integral with the metal layer.

In an example embodiment, the metal layer may include at least one of indium, zinc, gallium, zirconium, copper, or titanium.

In an example embodiment, the substrate may include a first base layer, a first barrier layer, a second base layer, and a second barrier layer that are sequentially stacked, and the hydrophobic blocking layer may cover a lateral surface of the second base layer that is exposed through the through portion.

In an example embodiment, the hydrophobic blocking layer may include a nano-structure including pores in an inside portion and a surface of the hydrophobic blocking layer.

In an example embodiment, the display apparatus may further include a surfactant layer on the hydrophobic blocking layer, and the surfactant layer may include at least one of stearic acid, oleic acid, or fluorosilane.

In an example embodiment, surfactants of the surfactant layer may fill the pores.

In an example embodiment, the display apparatus may further include an inner dam surrounding the through portion at the second non-display area, and the metal layer may be between the inner dam and the through portion.

In an example embodiment, the display apparatus may further include an encapsulation layer on the plurality of display elements, and including a first inorganic encapsulation layer, an organic encapsulation layer, and a second inorganic encapsulation layer that are sequentially stacked. The organic encapsulation layer may be outside a region partitioned by the inner dam, the first inorganic encapsulation layer and the second inorganic encapsulation layer may extend to the through portion and may directly contact each other between the inner dam and the through portion, and the metal layer may be on the second inorganic encapsulation layer.

In an example embodiment, each of the plurality of display elements may include a pixel electrode, an opposite electrode, and an intermediate layer. The pixel electrode may be on a planarization layer, the opposite electrode may be over the pixel electrode, and the intermediate layer may be between the pixel electrode and the opposite electrode. At least one layer of the intermediate layer and the opposite electrode may extend to the second non-display area, and the hydrophobic blocking layer may cover lateral surfaces of the at least one layer of the intermediate layer and the opposite electrode exposed by the through portion.

According to one or more example embodiments of the present disclosure, a method of manufacturing a display apparatus including a display area, a first non-display area, and a second non-display area, the first non-display area being outside the display area, and the second non-display area being at least partially surrounded by the display area, includes: forming, at the display area, a plurality of thin film transistors over a substrate, a planarization layer to cover the plurality of thin film transistors, and a plurality of pixel electrodes on the planarization layer and electrically connected to the plurality of thin film transistors; forming an intermediate layer and an opposite electrode on the plurality of pixel electrodes; sequentially forming a first inorganic encapsulation layer, an organic encapsulation layer, and a second inorganic encapsulation layer on the opposite electrode; forming a metal layer at the second non-display area; and forming a through portion in a region of the metal layer by irradiating a laser on the region, the through portion having a width less than an area of the metal layer. A hydrophobic blocking layer is formed on an inner surface of the through portion while the through portion is formed, and the hydrophobic blocking layer includes an oxide of a metal material of the metal layer.

In an example embodiment, the hydrophobic blocking layer may be integral with the metal layer.

In an example embodiment, the hydrophobic blocking layer may include an oxide of at least one of indium, zinc, gallium, zirconium, copper, or titanium.

In an example embodiment, the substrate may include a first base layer, a first barrier layer, a second base layer, and a second barrier layer that are sequentially stacked, and the hydrophobic blocking layer may cover a lateral surface of the second base layer that is exposed through the through portion.

In an example embodiment, the hydrophobic blocking layer may be formed by melting and recrystallization of the metal layer, and redeposition of clusters of scattered metal particles of the metal layer.

In an example embodiment, the method may further include coating surfactants on the hydrophobic blocking layer.

In an example embodiment, the hydrophobic blocking layer may include pores in an inside portion and a surface of the hydrophobic blocking layer, and the surfactants may fill the pores.

In an example embodiment, the surfactants may include at least one of stearic acid, oleic acid, or fluorosilane.

In an example embodiment, the metal layer may be formed on the second inorganic encapsulation layer.

In an example embodiment, at least one layer of the intermediate layer and the opposite electrode may extend to the second non-display area, and the hydrophobic blocking layer may cover lateral surfaces of the at least one layer of the intermediate layer and the opposite electrode exposed by the through portion.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
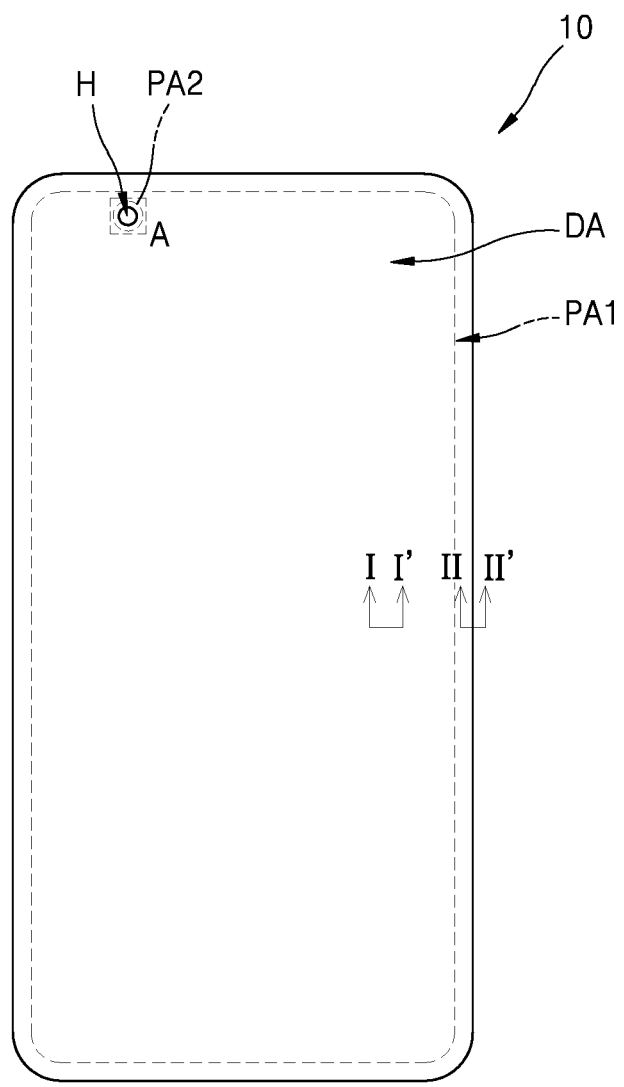
FIG. 1 is a plan view of an example of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Further, when a certain embodiment may be implemented differently, a specific process order may be performed differently from the described order. For example, two consecutively described processes may be performed at the same or substantially at the same time, or may be performed in an order opposite to the described order. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. In other words, because sizes and thicknesses of components in the drawings are arbitrarily illustrated for convenience of illustration, the following embodiments are not limited thereto. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
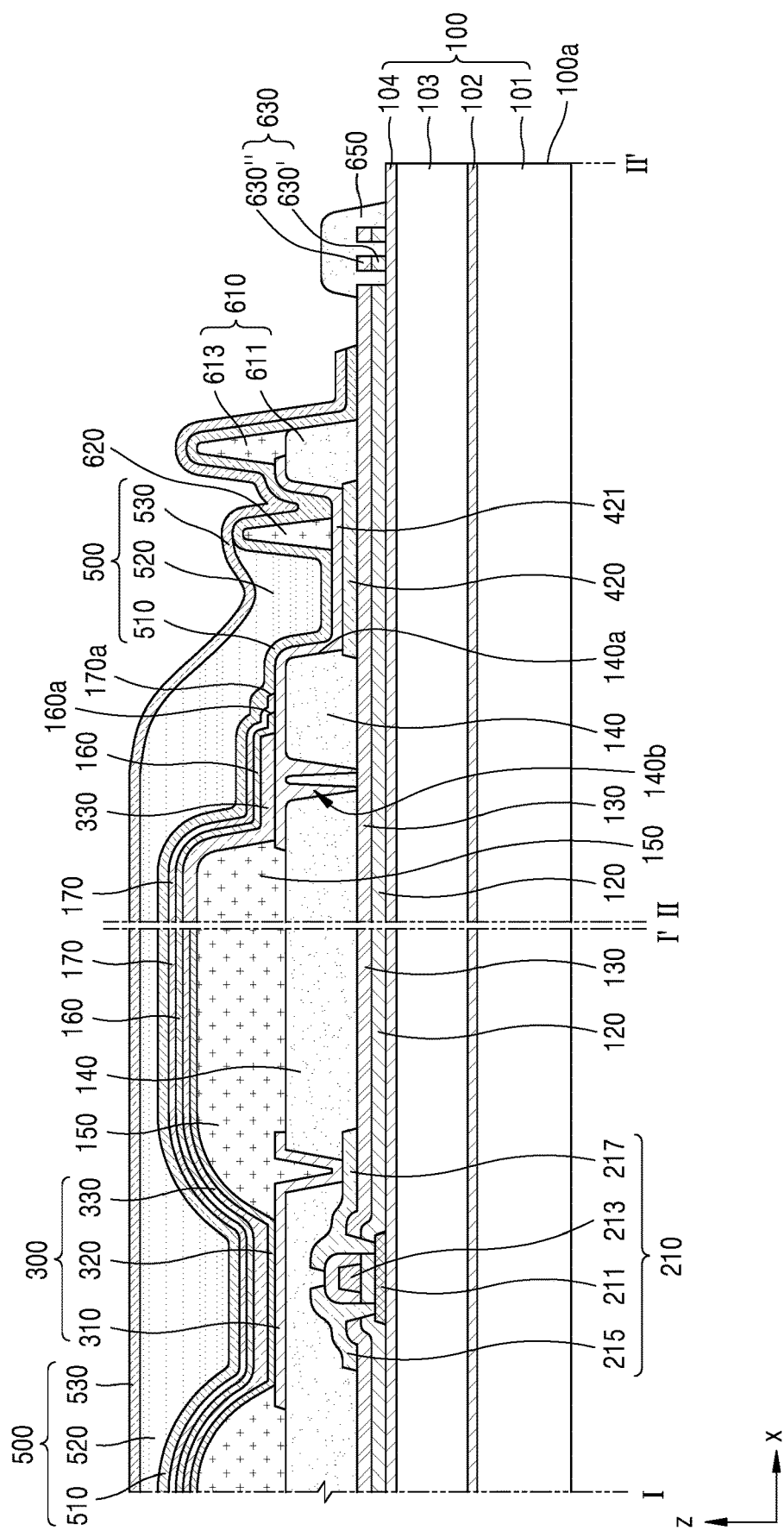
FIG. 2 is a cross-sectional view of the display apparatus taken along the lines I-I' and II-II" of FIG. 1 according to an embodiment.

FIG. 1 is a plan view of an example of a display apparatus 10 according to an embodiment, and FIG. 2 is a cross-sectional view of the display apparatus 10 taken along the lines I-I' and II-II" of FIG. 1.

Referring to FIGS. 1 and 2, the display apparatus 10 according to an embodiment includes a display area DA, a first non-display area PA1, and a second non-display area PA2. The display area DA displays an image, the first non-display area PA1 is outside the display area DA, and at least a portion of the second non-display area PA2 is surrounded (e.g., around a periphery thereof) by the display area DA. In other words, a substrate 100 may be understood as including the display area DA, the first non-display area PA1, and the second non-display area PA2.

A display element is arranged at (e.g., in or on) the display area DA. The first non-display area PA1 may include a pad area, the pad area being a region in which various suitable electronic elements or a printed circuit board, and/or the like are electrically attached.

Further, a thin film transistor 210 may be arranged at (e.g., in or on) the display area DA. The thin film transistor 210 may be electrically connected to the display element. It is shown in FIG. 2 that an organic light-emitting diode 300 as the display element is arranged at (e.g., in or on) the display area DA. When the organic light-emitting diode 300 is electrically connected to the thin film transistor 210, a pixel electrode 310 of the organic light-emitting diode 300 is electrically connected to the thin film transistor 210.

The second non-display area PA2 may be at least partially surrounded (e.g., around a periphery thereof) by the display area DA, and arranged between the display area DA and a through portion (e.g., a through hole) H. Though it is shown in FIG. 1 that the second non-display area PA2 may be arranged within (e.g., arranged inside) the display area DA and entirely surrounded (e.g., around a periphery thereof) by the display area DA, the present disclosure is not limited thereto. For example, a portion of the second non-display area PA2 may contact the first non-display area PA1.

The through portion (e.g., the through hole) H may serve as a space for a separate member for performing part of the function of the display apparatus 10, or a separate member which may add a new function to the display apparatus 10. For example, a sensor, a light source, a camera module, and/or the like may be arranged (e.g., may be located or may be positioned) in the through portion H. However, the present disclosure is not limited to a single through portion, and in some embodiments, two or more through portions H may be provided.

Because the through portion H is a region that vertically passes through the substrate 100 and a plurality of layers stacked on the substrate 100, external moisture and/or oxygen may penetrate into the display apparatus 10 through an inner vertical surface (e.g., an inner vertical wall) of the display apparatus 10 exposed by the through portion H. However, according to an embodiment, because a hydrophobic blocking layer 800 (e.g., see FIG. 5) is formed on an inner surface of the through portion H, the moisture transmission may be effectively prevented or substantially reduced. The hydrophobic blocking layer 800 is described in more detail below (e.g., see FIG. 5). The configuration of the display apparatus 10 is first described in more detail below with reference to FIG. 2.

The substrate 100 may include various suitable materials. In a bottom-emission type display apparatus in which an image is displayed in the direction toward the substrate 100, the substrate 100 may include a transparent material. In contrast, in a top-emission type display apparatus in which an image is displayed in an opposite direction away from the substrate 100, the substrate 100 may not include a transparent material. In this example, the substrate 100 may include a metal. In the example where the substrate 100 includes a metal, the substrate 100 may include at least one of iron, chrome, manganese, nickel, titanium, molybdenum, stainless steel, stainless use steel (SUS), invar alloy, inconel alloy, or kovar alloy.

For example, the substrate 100 may have a multi-layered structure in which a first base layer 101, a first barrier layer 102, a second base layer 103, and a second barrier layer 104 are sequentially stacked.

The first base layer 101 and the second base layer 103 may include, for example, a transparent glass material including $SiO_2$ as a main component. However, the first base layer 101 and the second base layer 103 are not necessarily limited thereto and may include, for example, a transparent plastic material. The plastic material may include polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose tri acetate (TAC), cellulose acetate propionate (CAP), and/or the like.

The first base layer 101 and the second base layer 103 may have the same thickness or different thicknesses from each other. For example, the first base layer 101 and the second base layer 103 may each include polyimide, and may each have a thickness of about 3 μm to about 20 μm.

The first barrier layer 102 and the second barrier layer 104 are layers configured to prevent or substantially prevent external foreign substances from penetrating into the display apparatus 10 through the substrate 100, and may have a single layer structure or a multi-layered structure including an inorganic material, for example, such as silicon nitride (SiN$_x$), silicon oxide (SiO$_x$), and/or the like. For example, the first barrier layer 102 may have a multi-layered structure including an amorphous silicon layer and a silicon oxide layer to improve adhesive force between neighbor layers (e.g., between adjacent layers), and the second barrier layer may include a silicon oxide layer. In addition, the first barrier layer 102 and the second barrier layer 104 may each have a thickness of about 4000 Å to about 7000 Å, but the present disclosure is not limited thereto.

A buffer layer may be further arranged on the substrate 100. The buffer layer may block or substantially block foreign substances and/or moisture from penetrating through the substrate 100. For example, the buffer layer may include an inorganic material or an organic material. The inorganic material may include silicon oxide, silicon nitride, silicon oxynitride, aluminum oxide, aluminum nitride, titanium oxide, titanium nitride, and/or the like, and the organic material may include polyimide, polyester, acryl, and/or the like. The buffer layer may include a plurality of stacked bodies including one or more of the above materials. In an embodiment, the second barrier layer 104 of the substrate 100 may be understood as a portion of the buffer layer having a multi-layered structure.

The thin film transistor 210 is arranged at (e.g., in or on) the display area DA of the substrate 100. In addition to the thin film transistor 210, a display element is arranged at (e.g., in or on) the display area DA such that the display element is electrically connected to the thin film transistor 210. FIG. 2 shows the organic light-emitting diode 300 as the display element. A thin film transistor may also be arranged at (e.g., in or on) the first non-display area PA1. The thin film transistor arranged at (e.g., in or on) the first non-display area PA1 may include, for example, a portion of a circuit portion configured to control an electric signal applied to the display area DA.

The thin film transistor 210 includes a semiconductor layer 211, a gate electrode 213, a source electrode 215, and a drain electrode 217. The semiconductor layer 211 includes amorphous silicon, polycrystalline silicon, or an organic semiconductor material. In the example where the buffer layer is arranged on the substrate 100, the semiconductor layer 211 may be arranged on the buffer layer.

The gate electrode 213 is arranged over the semiconductor layer 211. The source electrode 215 is electrically connected to the drain electrode 217 depending on a signal applied to the gate electrode 213. The gate electrode 213 may include, for example, at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu), and may have a single-layer structure or a multi-layered structure. In this example, to secure insulation between the semiconductor layer 211 and the gate electrode 213, a first inorganic insulating layer 120 may be arranged between the semiconductor layer 211 and the gate electrode 213. The first inorganic insulating layer 120 may include an inorganic material, for example, such as silicon oxide, silicon nitride, or silicon oxynitride. The first inorganic insulating layer 120 may be formed over the display area DA, the first non-display area PA1, and the second non-display area PA2.

A second inorganic insulating layer 130 may be arranged on the gate electrode 213, and may have a single-layer structure or a multi-layered structure. The second inorganic insulating layer 130 may include an inorganic material, for example, such as silicon oxide, silicon nitride, or silicon oxynitride. The second inorganic insulating layer 130 may be formed over the display area DA, the first non-display area PA1, and the second non-display area PA2.

The source electrode 215 and the drain electrode 217 are arranged on the second inorganic insulating layer 130. The source electrode 215 and the drain electrode 217 are each connected to the semiconductor layer 211 through contact holes formed in the second inorganic insulating layer 130 and the first inorganic insulating layer 120. The source electrode 215 and the drain electrode 217 may include, for example, at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu) according to a suitable conductivity, and may each have a single-layer structure or a multi-layered structure.

A protective layer may be arranged to protect the thin film transistor 210 having the above structure. The protective layer may include, for example, an inorganic material such as silicon oxide, silicon nitride, silicon oxynitride, and/or the like. The protective layer may include a single layer structure or a multi-layered structure.

A planarization layer 140 may be arranged on the thin film transistor 210. For example, as shown in FIG. 2, in the example where the organic light-emitting diode 300 is arranged at a location higher than the thin film transistor 210, the planarization layer 140 may planarize or substantially planarize bending (e.g., a step) that may be caused by the thin film transistor 210 by covering the thin film transistor 210. The planarization layer 140 may include an organic insulating material, for example, such as acryl, benzocyclobutene (BCB), or hexamethyldisiloxane (HMDSO). Though it is shown in FIG. 2 that the planarization layer 140 has a single layer structure, the present disclosure is not limited thereto, and in some examples, the planarization layer 140 may have a multi-layered structure and various suitable modifications may be made thereto. The display apparatus 10 according to the present embodiment may include both the protective layer and the planarization layer 140, or may include only the planarization layer 140 as needed or desired.

The organic light-emitting diode 300 is arranged on the planarization layer 140 inside the display area DA. The organic light-emitting diode 300 includes the pixel electrode 310, the opposite electrode 330, and an intermediate layer 320. The intermediate layer 320 is arranged between the pixel electrode 310 and the opposite electrode 330, and may include an emission layer.

The planarization layer 140 includes an opening that exposes at least one of the source electrode 215 and the drain electrode 217 of the thin film transistor 210. The pixel electrode 310 is arranged on the planarization layer 140 and is electrically connected to the thin film transistor 210 by contacting one of the source electrode 215 and the drain electrode 217 through the opening.

The pixel electrode 310 may include a transparent (or semi-transparent) electrode or a reflective electrode. In the example where the pixel electrode 310 includes the transparent (or semi-transparent) electrode, the pixel electrode 310 may include, for example, indium tin oxide (ITO), indium zinc oxide (IZO), zinc oxide (ZnO), indium oxide ($In_2O_3$), indium gallium oxide (IGO), aluminum zinc oxide (AZO), and/or the like. In the example where the pixel electrode 310 includes the reflective electrode, the pixel electrode 310 may include a reflective layer and a layer including, for example, indium tin oxide (ITO), indium zinc oxide (IZO), zinc oxide (ZnO), indium oxide ($In_2O_3$), indium gallium oxide (IGO), or aluminum zinc oxide (AZO), and the reflective layer may include, for example, at least one of Ag, Mg, Al, Pt, Pd, Au, Ni, Nd, Ir, Cr, or a compound thereof. However, the present disclosure is not limited thereto, and the pixel electrode 310 may include various suitable materials and a structure thereof may have a single layer or multiple layers, but various suitable modifications may be made thereto.

A pixel-defining layer 150 may be arranged on the planarization layer 140. The pixel-defining layer 150 defines a pixel by including an opening corresponding to each subpixel, for example, an opening exposing at least a central portion of the pixel electrode 310. In addition, in the example shown in FIG. 2, the pixel-defining layer 150 prevents or substantially prevents an arc (e.g., an electric arc or arc discharge), and/or the like from occurring at the edges of the pixel electrode 310 by increasing a distance between the edges of the pixel electrode 310 and the opposite electrode 330 over the pixel electrode 310. The pixel-defining layer 150 may include an organic insulating material, for example, such as polyimide or HMDSO.

The intermediate layer 320 of the organic light-emitting diode 300 includes the emission layer. The emission layer may include a polymer organic material or a low molecular weight organic material for emitting light having a desired color (e.g., a preset color). In addition, the intermediate layer 320 may include at least one functional layer from among a hole transport layer (HTL), a hole injection layer (HIL), an electron transport layer (ETL), and an electron injection layer (EIL). The functional layer may include an organic material. Some of a plurality of layers of the intermediate layer 320, for example, the functional layer(s), may be formed as one body (e.g., as a uniform, continuous body/layer) over a plurality of organic light-emitting diodes 300.

The opposite electrode 330 may cover the display area DA. The opposite electrode 330 may be formed as one body (e.g., as a uniform, continuous body/layer) over the plurality of organic light-emitting diodes 300 to correspond to the plurality of pixel electrodes 310. The opposite electrode 330 may include a transparent (or semi-transparent) electrode or a reflective electrode. In the example where the opposite electrode 330 includes a transparent (or semi-transparent) electrode, the opposite electrode 330 may include a layer including a metal having a small work function, for example, such as Li, Ca, LiF/Ca, LiF/Al, Al, Ag, Mg, and/or a compound thereof, and a transparent (or semi-transparent) conductive layer including, for example, ITO, IZO, ZnO, or $In_2O_3$. In the example where the opposite electrode 330 includes a reflective electrode, the opposite electrode 330 may include a layer including at least one of Li, Ca, LiF/Ca, LiF/Al, Al, Ag, Mg, or a compound thereof. The configuration and the material of the opposite electrode 330 are not limited thereto and may be variously modified as needed or desired.

For the display apparatus 10 to display an image, an electric signal set in advance (e.g., a preset or predefined electrical signal) may be applied to the opposite electrode 330. For example, a voltage line 420 may be arranged at (e.g., in or on) the first non-display area PA1, and may transfer an electric signal set in advance to the opposite electrode 330. The voltage line 420 may include a common power voltage line ELVSS.

The voltage line 420 may include the same or substantially the same material as that of various conductive layers, and be concurrently (e.g., simultaneously) formed while the various conductive layers are formed. It is shown in FIG. 2 that, similar to the source electrode 215 and the drain electrode 217 of the thin film transistor 210 inside the display area DA that are arranged on the second inorganic insulating layer 130, the voltage line 420 may be arranged on the second inorganic insulating layer 130 at (e.g., in or on) the first non-display area PA1. In this example, while the source electrode 215 and the drain electrode 217 of the thin film transistor 210 inside the display area DA are formed on the second inorganic insulating layer 130, the voltage line 420 may be formed on the second inorganic insulating layer 130 at (e.g., in or on) the first non-display area PA1 by using the same or substantially the same material as that of the source electrode 215 and the drain electrode 217. Therefore, the voltage line 420 may have the same or substantially the same structure as that of the source electrode 215 and the drain electrode 217. However, the present disclosure is not limited thereto. For example, while the gate electrode 213 is formed, the voltage line 420 may be concurrently (e.g., simultaneously) formed on the first inorganic insulating layer 120 by using the same or substantially the same material as the gate electrode 213. However, the present disclosure is not limited thereto and various suitable modifications may be made as needed or desired.

In some embodiments, the opposite electrode 330 may directly contact the voltage line 420, or as shown in FIG. 2, may be electrically connected to the voltage line 420 through a protection conductive layer 421. The protection conductive layer 421 may be arranged on the planarization layer 140, and may extend on the voltage line 420 and electrically connected to the voltage line 420. Therefore, the opposite electrode 330 may contact the protection conductive layer 421 at (e.g., in or on) the first non-display area PA1, and the protection conductive layer 421 may contact the voltage line 420 at (e.g., in or on) the first non-display area PA1.

Because the protection conductive layer 421 may be arranged on the planarization layer 140 as shown in FIG. 2, the protection conductive layer 421 may be concurrently (e.g., simultaneously) formed with an element arranged on the planarization layer 140 inside the display area DA by using the same or substantially the same material as that of the element. For example, while the pixel electrode 310 is formed on the planarization layer 140 inside the display area DA, the protection conductive layer 421 may be formed on the planarization layer 140 at (e.g., in or on) the first non-display area PA1 by using the same or substantially the same material as that of the pixel electrode 310. Therefore, the protection conductive layer 421 may have the same or substantially the same structure as that of the pixel electrode 310. As shown in FIG. 2, the protection conductive layer 421 may cover a portion of the voltage line 420 that is exposed by virtue of not being covered by the planarization layer 140. With this configuration, a portion of the voltage line 420 that is exposed to the outside of the planarization layer 140 may be prevented or substantially prevented from being damaged during a process of forming a first limit dam (e.g., a first protrusion or first limiting barrier) 610 or a second limit dam (e.g., a second protrusion or second limiting barrier) 620.

To prevent or substantially prevent impurities such as external oxygen and/or moisture, and/or the like from penetrating into the display area DA through the planarization layer 140, the planarization layer 140 may include an opening 140b in the first non-display area PA1 as shown in FIG. 2. The opening 140b may surround (e.g., around a periphery of) the display area DA. In addition, while the protection conductive layer 421 is formed, the protection conductive layer 421 may fill the opening 140b. With this configuration, impurities penetrating into the planarization layer 140 at (e.g., in or on) the first non-display area PA1 may be effectively prevented from penetrating into the planarization layer 140 inside the display area DA.

A capping layer 160 may be arranged on the opposite electrode 330. The capping layer 160 may improve the efficiency of light generated from the organic light-emitting diode 300. The capping layer 160 covers the opposite electrode 330, and may extend outside (e.g., may extend past) the opposite electrode 330 to contact the protection conductive layer 421 arranged under the opposite electrode 330. Because the opposite electrode 330 covers the display area DA and extends outside the display area DA, the capping layer 160 also covers the display area DA and extends to the first non-display area PA1 outside the display area DA. The capping layer 160 may include an organic material.

As described above, the capping layer 160 improves the efficiency of light generated from the organic light-emitting diode 300. For example, the capping layer 160 may raise a light-extraction efficiency to the outside. In some embodiments, the efficiency improvement by the capping layer 160 may be uniformly made in the display area DA. In this example, the capping layer 160 may have a top surface corresponding to a bend (e.g., a step) of the top surface of a layer thereunder considering a desired light efficiency improvement. In other words, as shown in FIG. 2, the top surface of the capping layer 160 may have a shape corresponding to the bend (e.g., the step) of the top surface of the opposite electrode 330 at (e.g., in) a portion of the capping layer 160 that is arranged on the opposite electrode 330.

An encapsulation layer 500 is arranged on the capping layer 160. The encapsulation layer 500 protects the organic light-emitting diode 300 from external moisture and/or oxygen, and/or the like. For this purpose, the encapsulation layer 500 has a shape covering the display area DA in which the organic light-emitting diode 300 is arranged and extending to the first non-display area PA1 outside the display area DA. The encapsulation layer 500 may have a multi-layered structure. For example, as shown in FIG. 2, the encapsulation layer 500 may include a first inorganic encapsulation layer 510, an organic encapsulation layer 520, and a second inorganic encapsulation layer 530.

The first inorganic encapsulation layer 510 covers the capping layer 160, and may include silicon oxide, silicon nitride, and/or silicon oxynitride.

Because the first inorganic encapsulation layer 510 is formed along a structure thereunder, a top surface of the first inorganic encapsulation layer 510 may not be flat as shown in FIG. 2. The organic encapsulation layer 520 covers the first inorganic encapsulation layer 510, and has a sufficient thickness, and thus, a top surface of the organic encapsulation layer 520 may be flat or substantially flat over the entire display area DA. The organic encapsulation layer 520 may include, for example, polyethylene terephthalate, polyethylene naphthalate, polycarbonate, polyimide, polyethylene sulfonate, polyoxymethylene, polyarylate, hexamethyldisiloxane, an acrylic resin (e.g. polymethylmethacrylate, poly acrylic acid, and/or the like), or a suitable combination thereof.

The second inorganic encapsulation layer 530 may cover the organic encapsulation layer 520, and may include, for example, silicon oxide, silicon nitride, silicon oxynitride, and/or the like. The second inorganic encapsulation layer 530 may prevent or substantially prevent the organic encapsulation layer 520 from being exposed to the outside by extending outside (e.g., extending past) the organic encapsulation layer 520 and contacting the first inorganic encapsulation layer 510. For example, the second inorganic encapsulation layer 530 may contact the first inorganic encapsulation layer 510 at (e.g., in or on) the first non-display area PA1.

Because the encapsulation layer 500 includes the first inorganic encapsulation layer 510, the organic encapsulation layer 520, and the second inorganic encapsulation layer 530, even when cracks occur inside the encapsulation layer 500, the cracks may not be connected (e.g., may not extend) between the first inorganic encapsulation layer 510 and the organic encapsulation layer 520, or between the organic encapsulation layer 520 and the second inorganic encapsulation layer 530 through the above described multi-layered structure. With this configuration, formation of a path through which external moisture and/or oxygen penetrates into the display area DA may be prevented or reduced.

During a process of forming the encapsulation layer 500, one or more structures thereunder may be damaged. For example, the first inorganic encapsulation layer 510 may be formed by using chemical vapor deposition. While the first inorganic encapsulation layer 510 is formed by using chemical vapor deposition, a layer under (e.g., a layer directly under) the first inorganic encapsulation layer 510 may be damaged. Therefore, when the first inorganic encapsulation layer 510 is directly formed on the capping layer 160, the capping layer 160, which is configured to improve the efficiency of light generated from the organic light-emitting diode 300, may be damaged, and light efficiency of the display apparatus may be reduced or deteriorated. Therefore, to prevent or substantially prevent the capping layer 160 from being damaged during the process of forming the encapsulation layer 500, a protective layer 170 may be arranged between the capping layer 160 and the encapsulation layer 500. For example, the protective layer 170 may include LiF.

As described above, the capping layer 160 extends on the display area DA to the first non-display area PA1 outside the display area DA. Therefore, the protective layer 170 may extend outside (e.g., may extend past) the capping layer 160 such that the capping layer 160 does not directly contact the encapsulation layer 500. In this example, the protective layer 170 covers an end 160a of the capping layer 160, and an end 170a of the protective layer 170 is arranged on the planarization layer 140. For example, as shown in FIG. 2, the end 170a of the protective layer 170 directly contacts the protection conductive layer 421 on the planarization layer 140.

Because the first inorganic encapsulation layer 510, which is a lowermost layer of the encapsulation layer 500, does not contact the capping layer 160 that includes an organic material, and contacts the protective layer 170 that includes an inorganic material such as LiF, the adhesive force between the encapsulation layer 500 and the layer thereunder may be maintained or substantially maintained high. With this configuration, exfoliation of the encapsulation layer 500 from the layer thereunder during a process of manufacturing the display apparatus 10 or during use after the manufacturing thereof may be effectively prevented or reduced.

When forming the encapsulation layer 500, for example, when forming the organic encapsulation layer 520, it may be desirable to limit a material for forming the organic encapsulation layer 520, such that the material for forming the organic encapsulation layer 520 is arranged within a region set in advance (e.g., within a preset region). For this purpose, as shown in FIG. 2, the first limit dam 610 may be arranged at (e.g., in or on) the first non-display area PA1. For example, the first inorganic insulating layer 120, the second inorganic insulating layer 130, and the planarization layer 140 may be provided at (e.g., in or on) the display area DA and also at (e.g., in or on) the first non-display area PA1 as shown in FIG. 2. The first limit dam 610 is arranged at (e.g., in or on) the first non-display area PA1 to be spaced apart from the planarization layer 140.

The first limit dam 610 may have a multi-layered structure. For example, the first limit dam 610 may include a first layer 611 and a second layer 613 stacked in a direction (e.g., a z-direction) away from the substrate 100. The first layer 611 may be concurrently (e.g., simultaneously) formed with the planarization layer 140 formed at (e.g., in or on) the display area DA by using the same or substantially the same material as that of the planarization layer 140. The second layer 613 may be concurrently (e.g., simultaneously) formed with the pixel-defining layer 150 formed at (e.g., in or on) the display area DA by using the same or substantially the same material as that of the pixel-defining layer 150.

As shown in FIG. 2, in addition to the first limit dam 610, a second limit dam 620 may be arranged between the first limit dam 610 and an end 140a of the planarization layer 140. The second limit dam 620 may be arranged on a portion of the protection conductive layer 421 on the voltage line 420. The second limit dam 620 is arranged at (e.g., in or on) the first non-display area PA1 to be spaced apart from the planarization layer 140. Similar to the first limit dam 610, the second limit dam 620 may have a multi-layered structure, but the present disclosure is not limited thereto, and as shown in FIG. 2, the second limit dam 620 may have a single layer structure. For example, the second limit dam 620 may include a number of layers that is less than a number of layers of the first limit dam 610 to have a height lower than the height of the first limit dam 610, the heights being measured from the substrate 100. It is shown in FIG. 2 that the second limit dam 620 includes the same or substantially the same material as that of the second layer 613 of the first limit dam 610, and is concurrently (e.g., simultaneously) formed with the second layer 613.

Because the organic encapsulation layer 520 is limited by (e.g., bound by) the second layer 620, flooding of the material for forming the organic encapsulation layer 520 to the outside of the second limit dam 620 may be prevented or substantially reduced during a process of forming the organic encapsulation layer 520. Even when the material for forming the organic encapsulation layer 520 partially floods over the second limit dam 620, the position of the material is limited by (e.g., bound by) the first limit dam 610, and may not flow (e.g., may not move any more) in a direction toward an edge 100a of the substrate 100. In contrast, the first inorganic encapsulation layer 510 and the second inorganic encapsulation layer 530, which may be formed through chemical vapor deposition, may cover the second limit dam 620 and the first limit dam 610, and may extend to the outside of (e.g., may extend past) the first limit dam 610 as shown in FIG. 2.

As shown in FIG. 2, a crack prevention portion 630 is arranged at (e.g., in or on) the first non-display area PA1. The crack prevention portion 630 may extend along at least a portion of the edge 100a of the substrate 100. For example, the crack prevention portion 630 may have a shape that circumnavigates (e.g., that extends around a periphery of) the display area DA once. The crack prevention portion 630 may have a discontinuous shape in some sections. For example, in some sections, the crack prevention portion 630 may include portions that are spaced apart from each other along a periphery of the display area DA. The crack prevention portion 630 may prevent or substantially prevent a crack from being transferred to (e.g., from being extended to or being formed in) the display area DA. The crack may be generated in the first inorganic insulating layer 120 and the second inorganic insulating layer 130 by impulses, vibrations, and/or the like while a parent substrate is cut during a process of manufacturing the display apparatus 10, or during use of the display apparatus 10. The first inorganic insulating layer 120 and the second inorganic insulating layer 130 may each include an inorganic material.

The crack prevention portion 630 may have various suitable shapes. As shown in FIG. 2, the crack prevention portion 630 may be concurrently (e.g., simultaneously) formed with some elements formed at (e.g., in or on) the display area DA by using the same or substantially the same material as those elements, and may have a multi-layered structure. It is shown in FIG. 2 that the crack prevention portion 630 has a multi-layered structure including a bottom layer 630', and a top layer 630" on the bottom layer 630'. For example, it is shown in FIG. 2 that the crack prevention portion 630 includes the bottom layer 630' and the top layer 630", the bottom layer 630' including the same or substantially the same material as that of the first inorganic insulating layer 120, and the top layer 630" including the same or substantially the same material as that of the second inorganic insulating layer 130 on the first inorganic insulating layer 120. In the example where the buffer layer is formed on the substrate 100, the crack prevention portion 630 may include a layer including the same or substantially the same material as that of the buffer layer. In addition, as shown in FIG. 2, in some embodiments, the crack prevention portion 630 may include a plurality of crack prevention portions spaced apart from each other.

In some embodiments, the crack prevention portion 630 may be formed by removing a portion of the first inorganic insulating layer 120 and the second inorganic insulating layer 130. In other words, as shown in FIG. 2, the crack prevention portion 630 may include a groove, and a residual portion of the first inorganic insulating layer 120 and the second inorganic insulating layer 130 neighboring (e.g., adjacent to) the groove. The groove may be formed in at least one side of the crack prevention portion 630 by removing the first inorganic insulating layer 120 and the second inorganic insulating layer 130.

As shown in FIG. 2, the crack prevention portion 630 may be covered by a cover layer 650. The cover layer 650 may be concurrently (e.g., simultaneously) formed with the planarization layer 140 by using the same or substantially the same material as that of the planarization layer 140 while the planarization layer 140 is formed at (e.g., in or on) the display area DA. In other words, the cover layer 650 may include a layer including an organic material, the layer covering the crack prevention portion 630 including an inorganic material. The cover layer 650 may cover ends of the first inorganic insulating layer 120 and/or the second inorganic insulating layer 130 in a direction along the edge 100a of the substrate 100, and also covers the crack prevention portion 630.

Figure 3:
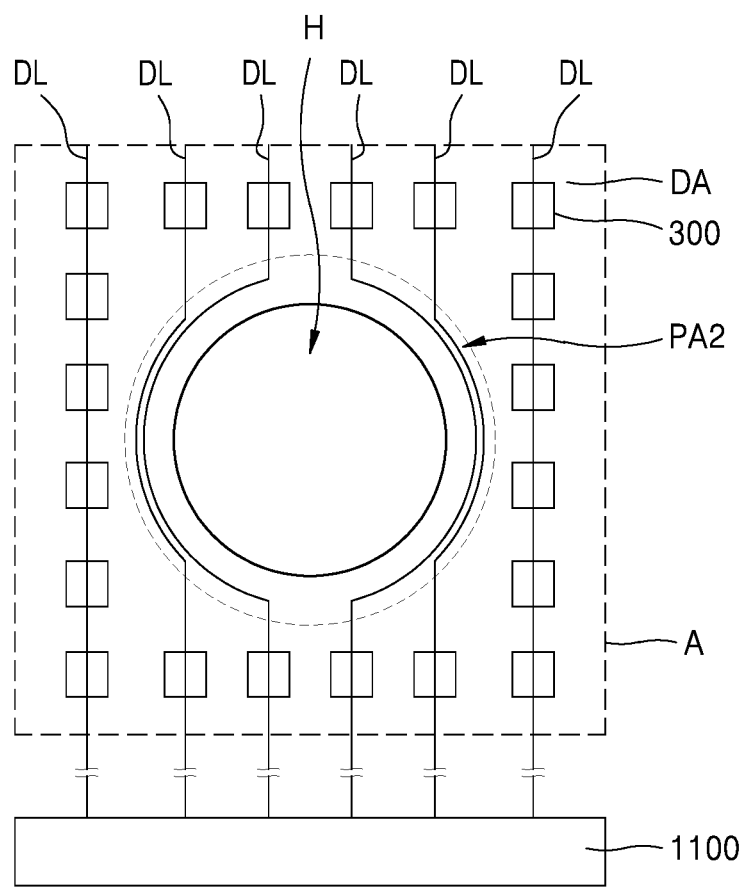
FIG. 3 is an enlarged plan view of the region A of FIG. 1 according to an embodiment.
Figure 4:
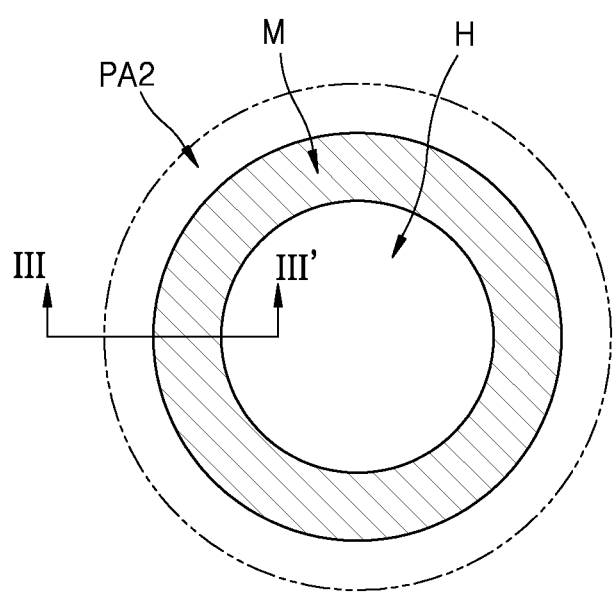
FIG. 4 is a plan view of an example of a through portion of FIG. 3 according to an embodiment.
Figure 5:
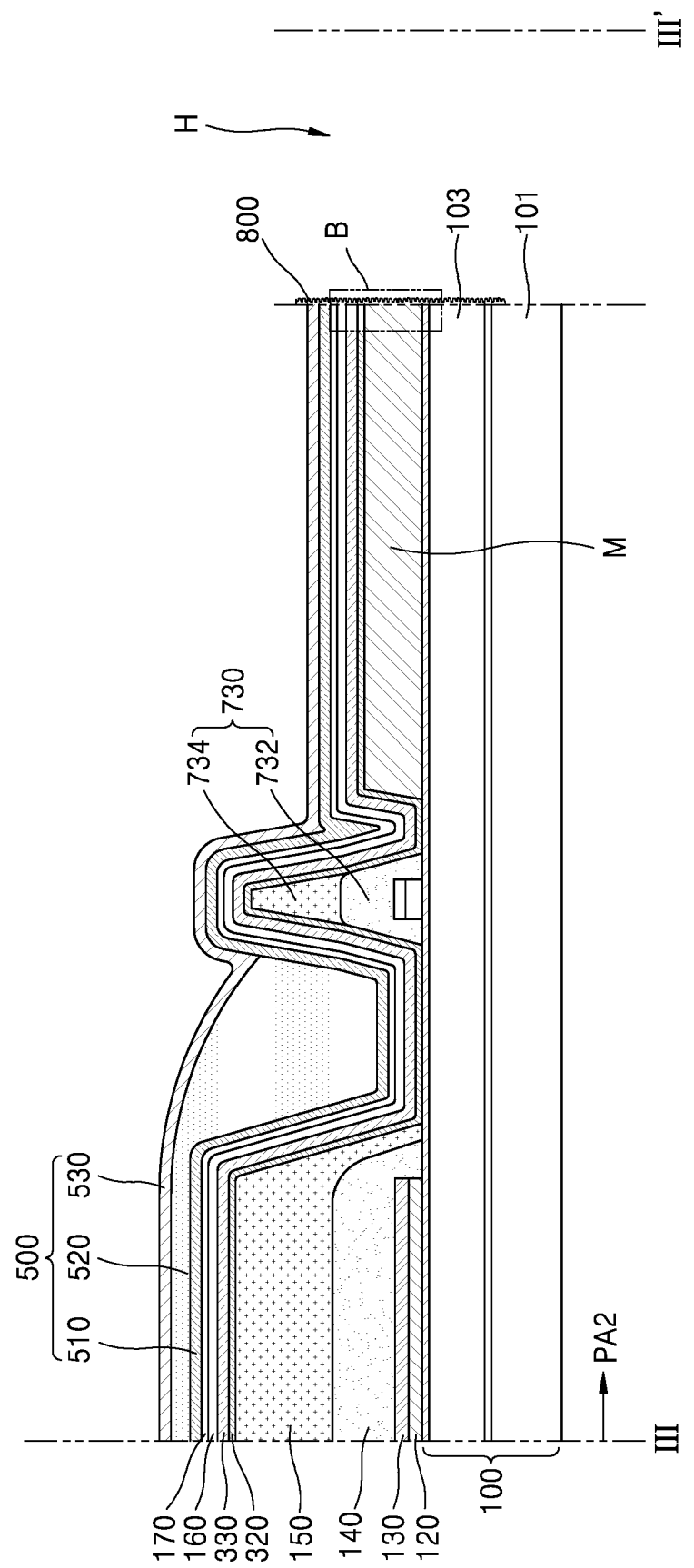
FIG. 5 is a cross-sectional view of the through portion taken along the line III-III' of FIG. 4 according to an embodiment.
Figure 6:
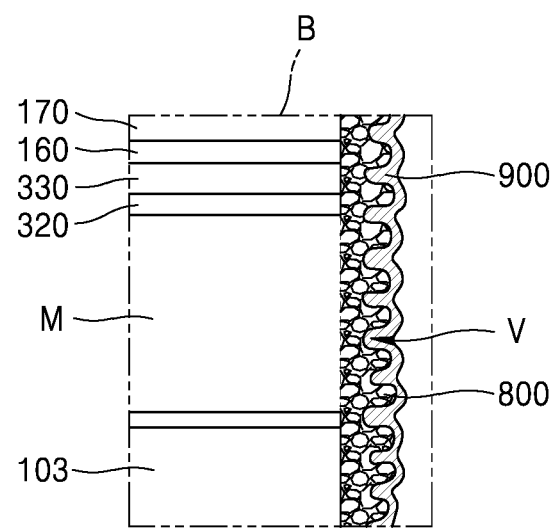
FIG. 6 is an enlarged cross-sectional view of the region B of FIG. 5 according to an embodiment.
Figure 7:
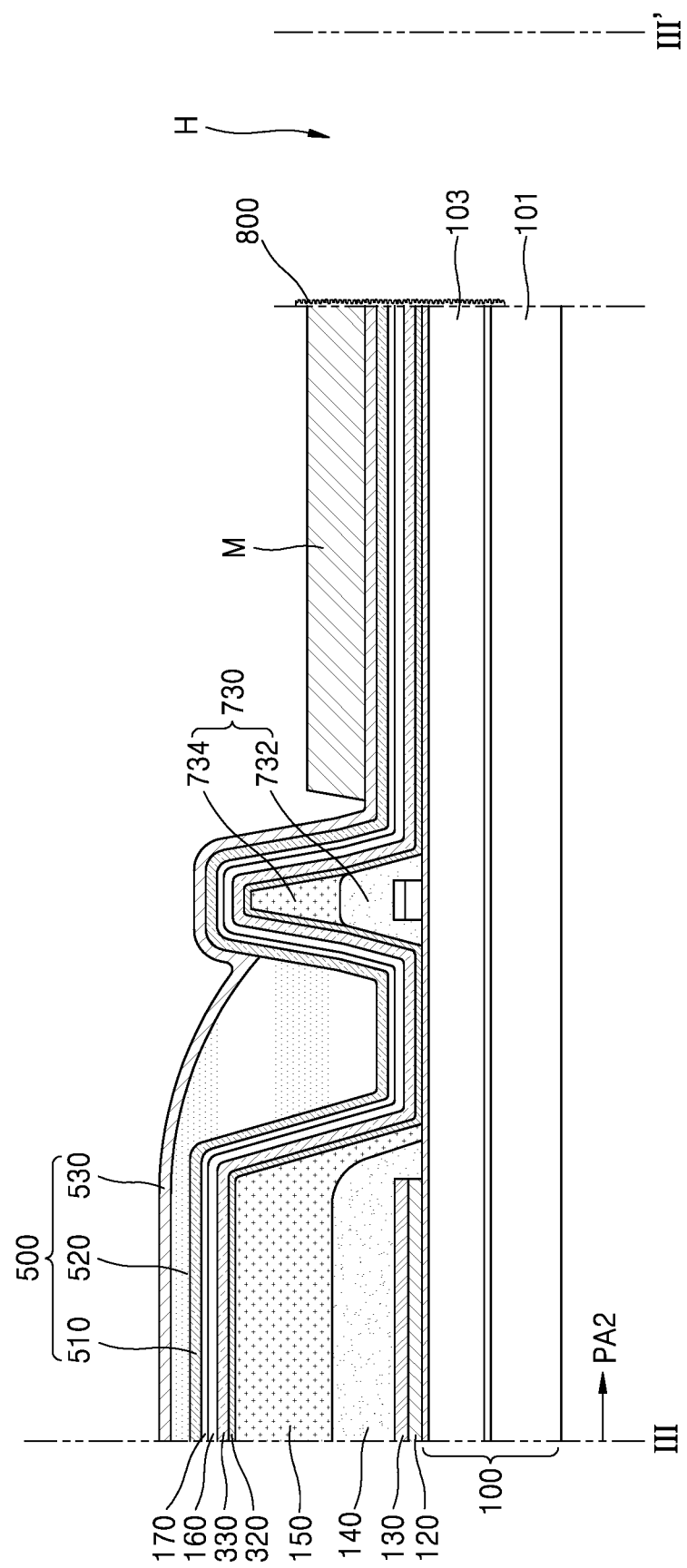
FIG. 7 is a cross-sectional view of the through portion taken along the line III-III' of FIG. 4 according to another embodiment.

FIG. 3 is an enlarged plan view of the region A of FIG. 1, FIG. 4 is a plan view of an example of a through portion H of FIG. 3, FIG. 5 is a cross-sectional view of an example of a cross-section taken along the line III-III' of FIG. 4, FIG. 6 is an enlarged cross-sectional view of the region B of FIG. 5, and FIG. 7 is a cross-sectional view of another example of a cross-section taken along the line III-III' of FIG. 4.

FIG. 3 shows the through portion H and surrounding area of the through portion H. Referring to FIG. 3, a plurality of organic light-emitting diodes 300 are arranged at (e.g., in or on) the display area DA around (e.g., a periphery of) the through portion H, the plurality of organic light-emitting diodes 300 being electrically connected to a corresponding data line DL. The second non-display area PA2 may be defined as a region in which an image is not displayed, and located between the through portion H and the display area DA.

The data lines DL may extend in a first direction and are electrically connected to a data driver 1100. For example, the data driver 1100 may be arranged at (e.g., in or on) the first non-display area PA1 (e.g., see FIG. 1) as a chip-on-panel (COP) type driver, or may be arranged on a flexible circuit board electrically connected to a terminal provided at (e.g., in or on) the first non-display area PA1 (e.g., see FIG. 1).

Some of the data lines DL extending in the first direction are not formed in a straight line shape in the first direction due to the through portion H arranged in the display area DA. In this example, some of the data lines DL may extend around (e.g., may detour around) the through portion H. In this example, some of the data lines DL extending around (e.g., detouring around) the through portion H are arranged at (e.g., in or on) the second non-display area PA2 surrounding (e.g., around a periphery of) the through portion H.

Scan lines may extend in a second direction crossing the data lines DL, and some of the scan lines may extend around (e.g., may detour around) the through portion H at (e.g., in or on) a region (e.g., the second non-display area PA2) in which the through portion H is formed. In another example, the display apparatus 10 (e.g., see FIG. 1) may allow the scan lines to not extend around (e.g., to not detour around) the through portion H by including two scan drivers on two opposite sides of the display area DA. In other words, a scan line electrically connected to the organic light-emitting diodes 300 on the left of the through portion H and a scan line electrically connected to the organic light-emitting diodes 300 on the right of the through portion H may be respectively connect to different scan drivers.

Referring to FIGS. 4 and 5 showing the through portion H in more detail, a metal layer M may be arranged around (e.g., a periphery of) the through portion H, which vertically passes through the substrate 100, and the metal layer M may surround (e.g., around a periphery of) the through portion H. The metal layer M may include, for example, at least one of indium, zinc, gallium, zirconium, copper, or titanium, and may have a thickness similar to (e.g., the same or substantially the same as) that of the second base layer 103. For example, the metal layer M may have a thickness of about 3 μm to about 20 μm.

The first inorganic insulating layer 120 and the second inorganic insulating layer 130 may extend to a portion of the second non-display area PA2, and ends of the first inorganic insulating layer 120 and the second inorganic insulating layer 130 may be covered by the planarization layer 140.

An inner dam 730 may be arranged at a position at (e.g., in or on) the second non-display area PA2 spaced apart from the planarization layer 140. The inner dam 730 may surround (e.g., around a periphery of) the through portion H, and may include, for example, a bottom layer 732 and a top layer 734. The bottom layer 732 may be concurrently (e.g., simultaneously) formed when the planarization layer 140 is formed by using the same or substantially the same material as that of the planarization layer 140, and the top layer 734 may be concurrently (e.g., simultaneously) formed when the pixel-defining layer 150 is formed by using the same or substantially the same material as that of the pixel-defining layer 150. The inner dam 730 may perform the same or substantially the same function as those of the first limit dam 610 (e.g., see FIG. 2) and the second limit dam 620 (e.g., see FIG. 2) described with reference to FIG. 3. Therefore, because the inner dam 730 prevents or substantially prevents the material for forming the organic encapsulation layer 520 from flowing toward the through portion H during a process of forming the organic encapsulation layer 520, the organic encapsulation layer 520 may be arranged outside a region partitioned by the inner dam 730. The first inorganic encapsulation layer 510 and the second inorganic encapsulation layer 530 may extend to the through portion H beyond the inner dam 730.

A hydrophobic blocking layer 800 may be arranged on an inner side surface of the through portion H. The hydrophobic blocking layer 800 may be formed while the metal layer M is cut together by a laser when the substrate 100, and/or the like are cut by laser irradiation to form the through portion H.

When forming the through portion H, the metal layer M is partially melted by the laser irradiation, flows along a lateral surface of the through portion H, and is recrystallized, and thus, metal particles scattered from the metal layer M are oxidized and aggregated, and then redeposited on the lateral surface of the through portion H to form the hydrophobic blocking layer 800. Therefore, the hydrophobic blocking layer 800 is formed as one body (e.g., as a uniform, continuous body/layer) with the metal layer M but may include oxide of the metal material of the metal layer M.

In addition, clusters in which the metal particles are aggregated are irregularly redeposited on the lateral surface of the through portion H. Consequently, the hydrophobic blocking layer 800 constitutes a nano structure having a complicated shape including pores (e.g., valleys) V at (e.g., in or on) an inside and surface thereof. Because the hydrophobic blocking layer 800 includes the pores V in the inside thereof, the hydrophobic blocking layer 800 may have hydrophobicity.

The hydrophobic blocking layer 800 is formed to have a width greater than the thickness of the metal layer M. The hydrophobic blocking layer 800 is formed by melting and recrystallization of the metal layer M during the laser irradiation process, and by redeposition of clusters of scattered metal particles. For example, the width of the hydrophobic blocking layer 800 in the length direction of the through portion H may be two or more times the thickness of the metal layer M. Because the thickness of the metal layer M may be the same as or substantially the same as (or similar to) the thickness of the second base layer 103, the hydrophobic blocking layer 800 formed from the metal layer M may cover at least the lateral surface of the second base layer 103 and the lateral surfaces of the intermediate layer 320, the opposite electrode 330, the capping layer 160, and the protective layer 170 arranged on the metal layer M and exposed by the through portion H.

Because it may be difficult for moisture, and/or the like to be introduced into the display apparatus 10 (e.g., see FIG. 1) through the first base layer 101, the hydrophobic blocking layer 800 may not completely cover the first base layer 101. In addition, as described above, because at least some of the functional layers of the intermediate layer 320 are formed as one body (e.g., as a uniform, continuous body/layer) over the plurality of organic light-emitting diodes 300, the intermediate layer 320 formed at (e.g., in or on) the second non-display area PA2 denotes these functional layers excluding the emission layer.

As described above, because the hydrophobic blocking layer 800 is formed on the lateral surface of the through portion H, and covers the lateral surfaces of the second base layer 103, the intermediate layer 320, the opposite electrode 330, the capping layer 160, and the protective layer 170 that are exposed by the through portion H, inflow of moisture, and/or the like introduced to the through portion H to the display apparatus 10 (e.g., see FIG. 1) through these layers may be blocked or substantially blocked.

In a comparative example, a plurality of grooves surrounding the through portion H and spaced apart from each other are formed in the depth direction of the substrate 100, and the intermediate layer 320 is disconnected by the grooves and discontinuously formed. Therefore, moisture transmission due to the through portion H is prevented or substantially reduced. However, to improve a moisture transmission prevention effect, lots of (e.g., a large number of) grooves should be formed, and accordingly, the area of the second non-display area PA2 may be increased. For example, in the comparative example, to form twenty grooves surrounding the through portion H, a length of about 300 μm is required for a region in which the grooves are arranged. In contrast, when the hydrophobic blocking layer 800 is formed on the lateral surface of the through portion H according to one or more embodiments of the present disclosure, the area of the second non-display area PA2 may be reduced, and thus, the display area DA (e.g., see FIG. 1) may be relatively extended (e.g., may be enlarged or increased).

In addition, as shown in FIG. 6, in some embodiments, a surfactant layer 900 may be further formed on the inner surface of the through portion H. The surfactant layer 900 may be formed by coating surfactants on the hydrophobic blocking layer 800. The surfactants of the surfactant layer 900 may include, for example, at least one of stearic acid, oleic acid, or fluorosilane. The surfactants may be coated on the surface of the hydrophobic blocking layer 800, and may fill the pores V inside the hydrophobic blocking layer 800. In this example, a head of the surfactants having hydrophilicity combines with the hydrophobic blocking layer 800 including a metal oxide, and hydrophobicity of the hydrophobic blocking layer 800 may be enhanced even more by a tail of the surfactants having hydrophobicity.

Though FIG. 6 shows an example in which the metal layer M is arranged on the substrate 100, the present disclosure is not limited thereto, and the position of the metal layer M may be variously modified. For example, as shown in FIG. 7, the metal layer M may be arranged on the second inorganic encapsulation layer 530 of the encapsulation layer 500. The metal layer M may be formed to have a thickness that is the same or substantially the same as (or similar to) that of the second base layer 103. A sum of the thickness of the intermediate layer 320 between the metal layer M and the second base layer 103, and the thicknesses of the opposite electrode 330, the capping layer 160, the protective layer 170, the first inorganic encapsulation layer 510, and the second inorganic encapsulation layer 530 may be much less than the thickness of the second base layer 103. Therefore, when the metal layer M is arranged on the second inorganic encapsulation layer 530, because the hydrophobic blocking layer 800 may be formed in a direction in which a laser is irradiated, the hydrophobic blocking layer 800 may be formed to cover the second base layer 103. For another example, the metal layer M may be arranged at various suitable positions such as between the first inorganic encapsulation layer 510 and the second inorganic encapsulation layer 530.

Figure 8:
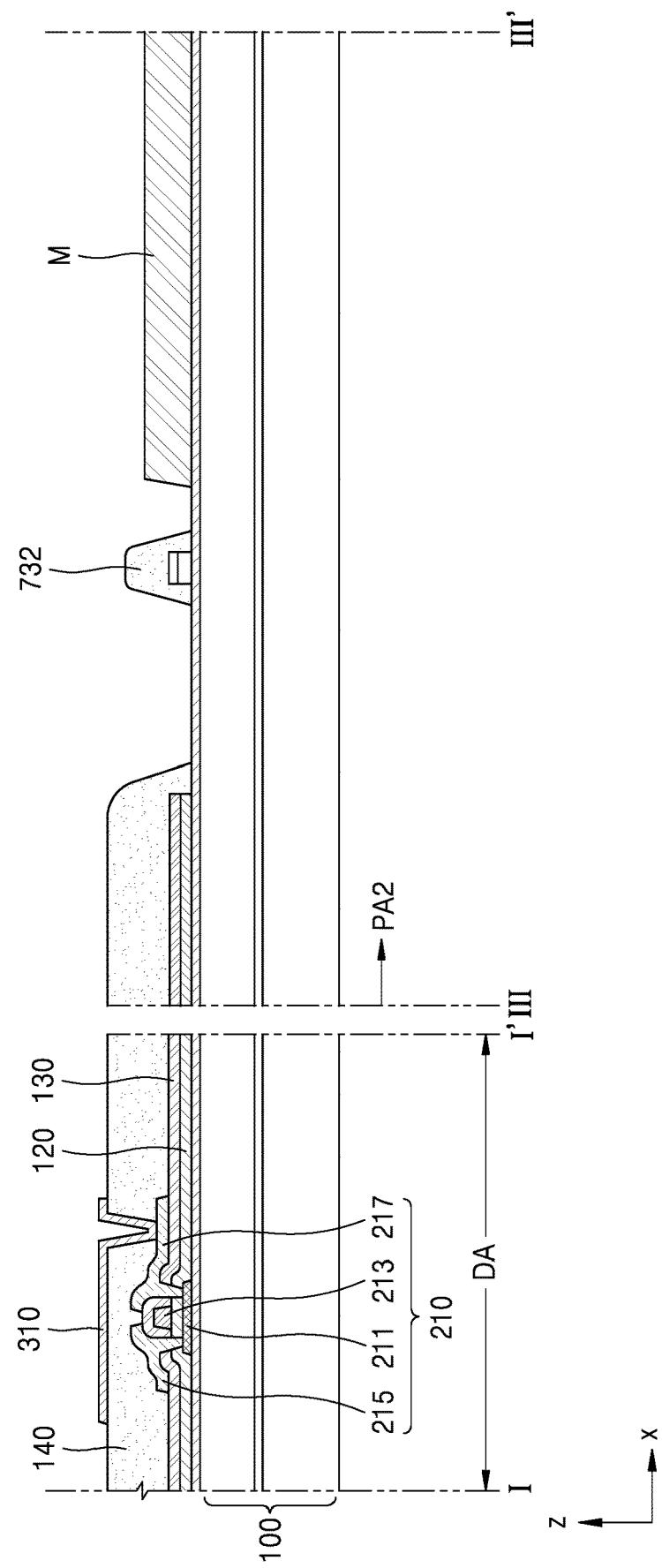
FIGS. 8-10 are cross-sectional views showing a process of manufacturing the display apparatus of FIG. 1 according to an embodiment.
Figure 9:
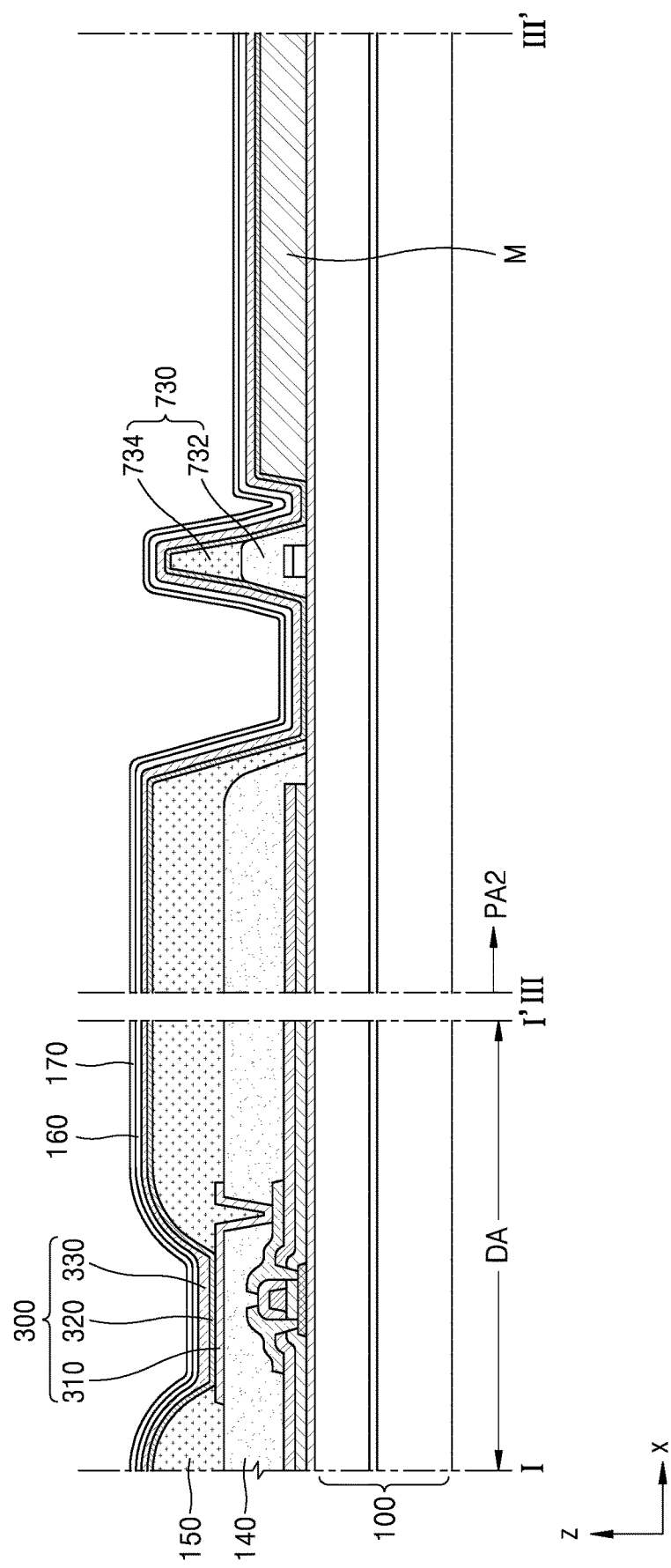
Figure 10:
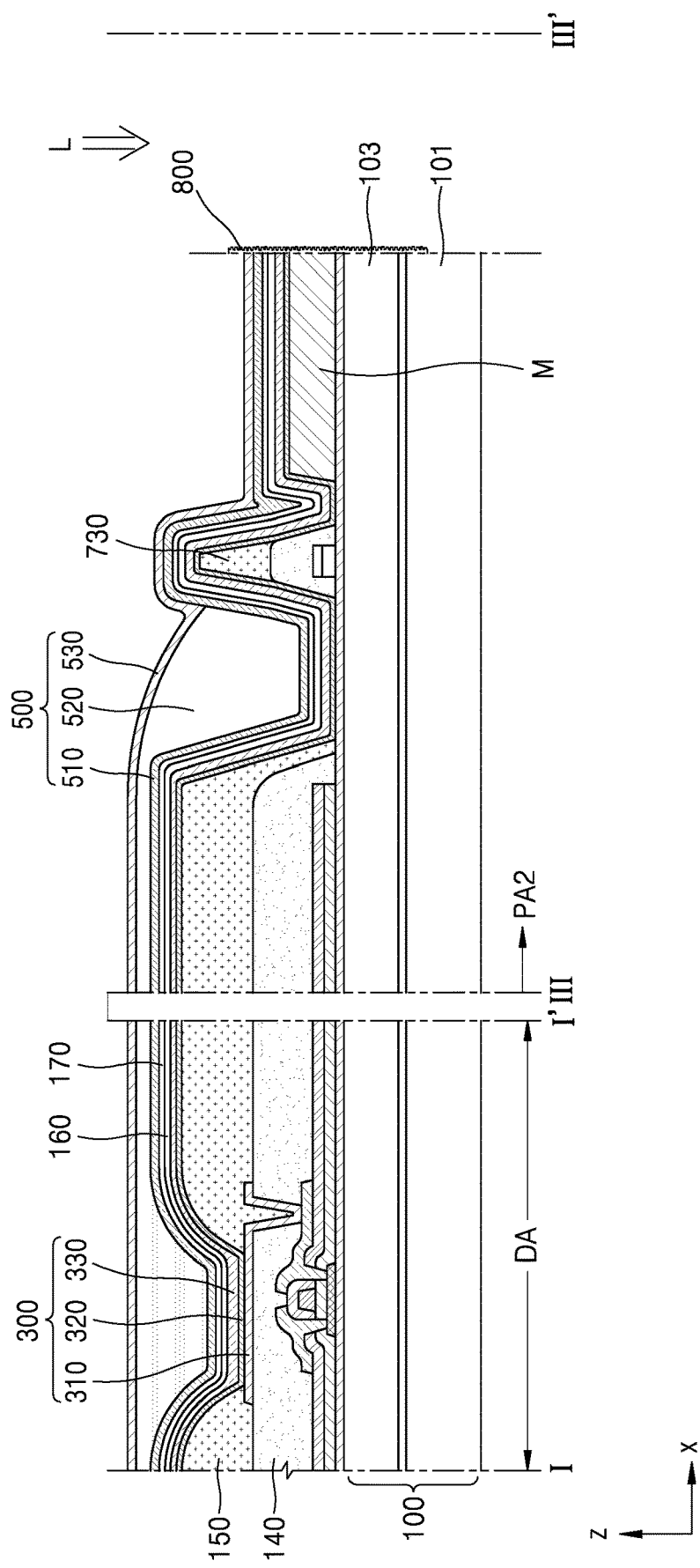

FIGS. 8 to 10 are cross-sectional views showing a process of manufacturing the display apparatus of FIG. 1, and show a cross-section taken along the line I-I' of FIG. 1 and a cross-section taken along the line III-III' of FIG. 4.

First, referring to FIG. 8, the thin film transistor 210 and the planarization layer 140 are formed over the substrate 100, the planarization layer 140 covering the thin film transistor 210. For example, the thin film transistor 210 may be arranged at (e.g., in or on) the display area DA, and the planarization layer 140 may extend to a portion of the second non-display area PA2.

The thin film transistor 210 includes the semiconductor layer 211, the gate electrode 213, the source electrode 215, and the drain electrode 217. The first inorganic insulating layer 120 including an inorganic material is formed between the semiconductor layer 211 and the gate electrode 213. In addition, the second inorganic insulating layer 130 formed between the gate electrode 213 and the source electrode 215 and between the gate electrode 213 and the drain electrode 217 includes an inorganic material. The first inorganic insulating layer 120 and the second inorganic insulating layer 130 may be formed over the display area DA and the first non-display area PA1 (e.g., see FIG. 1). In the second non-display area PA2, a portion of the first inorganic insulating layer 120 and the second inorganic insulating layer 130 is removed, and an end of the first inorganic insulating layer 120 and the second inorganic insulating layer 130 may be covered by the planarization layer 140.

Subsequently, an opening is formed in the planarization layer 140, which exposes the drain electrode 217. The pixel electrode 310 is formed on the planarization layer 140. The pixel electrode 310 may be formed by forming a metal material for forming the pixel electrode 310 over the substrate 100, and then patterning the metal material. The pixel electrode 310 may contact the drain electrode 217 through the opening.

When forming the planarization layer 140, the bottom layer 732 may be concurrently (e.g., simultaneously) formed at (e.g., in or on) the second non-display area PA2. The bottom layer 732 may have a closed curve shape.

In addition, the metal layer M is formed at (e.g., in or on) the second non-display area PA2. For example, the metal layer M may be formed at (e.g., in or on) a region formed by the bottom layer 732 over the substrate 100. However, the present disclosure is not limited thereto. For example, in another embodiment, after the encapsulation layer 500 shown in FIG. 10 is formed, the metal layer M may be formed on the second inorganic encapsulation layer 530. In other words, the metal layer M may be formed at various suitable positions.

The metal layer M may include at least one of indium, zinc, gallium, zirconium, copper, or titanium, and may have a thickness of about 3 μm to about 20 μm.

Subsequently, as shown in FIG. 9, the pixel-defining layer 150 is formed on the pixel electrode 310. The pixel-defining layer 150 may cover the edges of the pixel electrode 310, and may include an opening exposing the central portion of the pixel electrode 310. During a process of forming the pixel-defining layer 150, the top layer 734 is concurrently (e.g., simultaneously) formed on the bottom layer 732, and thus, the inner dam 730 may be formed at (e.g., in or on) the second non-display area PA2.

The organic light-emitting diode 300 is formed by stacking the intermediate layer 320 and the opposite electrode 330 on a portion of the pixel electrode 310 exposed through the opening of the pixel-defining layer 150. In this example, at least one functional layer of the intermediate layer 320 may be formed as one body (e.g., as a uniform, continuous body/layer) over the display area DA and the second non-display area PA2. In addition, the opposite electrode 330, the capping layer 160 on the opposite electrode 330, and the protective layer 170 may also be formed as one body (e.g., as a uniform, continuous body/layer) over the display area DA and the second non-display area PA2.

Next, as shown in FIG. 10, the first inorganic encapsulation layer 510, the organic encapsulation layer 520, and the second inorganic encapsulation layer 530 are sequentially formed, and then the through portion H is formed inside the second non-display area PA2 by irradiating a laser L. The through portion H is formed inside a region of the metal layer M, and has a size (e.g., a width) less than that of the metal layer M. Therefore, after the through portion H is formed, the metal layer M is arranged between the inner dam 730 and the through portion H.

The first inorganic encapsulation layer 510 and the second inorganic encapsulation layer 530 are formed at (e.g., in or on) not only the display area DA, but also at (e.g., in or on) the second non-display area PA2. In contrast, a region in which the organic encapsulation layer 520 is formed is limited by (e.g., bound by) the inner dam 730. Therefore, at (e.g., in or on) the second non-display area PA2, the first inorganic encapsulation layer 510 may directly contact the second inorganic encapsulation layer 530 between the inner dam 730 and the through portion H.

Because the through portion H vertically passes through the substrate 100, the metal layer M, the intermediate layer 320, the opposite electrode 330, the capping layer 160, the protective layer 170, the first inorganic encapsulation layer 510, and the second inorganic encapsulation layer 530 stacked on the substrate 100, the lateral surfaces of these layers may be exposed through the inner surface of the through portion H. Among them, exposed surfaces of the second base layer 103, the intermediate layer 320, and the capping layer 160, which each includes an organic material, may serve as a penetration path through which moisture, and/or the like penetrates into the display apparatus 10 (e.g., see FIG. 1). However, the hydrophobic blocking layer 800 formed from the metal layer M by the irradiation of the laser L is formed on the inner surface of the through portion H, and covers the lateral surfaces of at least the intermediate layer 320, the opposite electrode 330, the capping layer 160, and the protective layer 170. Therefore, the hydrophobic blocking layer 800 may effectively block or substantially block the moisture transmission, and the area of the second non-display area PA2 may be reduced.

Because the hydrophobic blocking layer 800 is formed by partial melting and recrystallization of the metal layer M through the irradiation of the laser L, and redeposition of clusters of scattered metal particles, the hydrophobic blocking layer 800 is integral with the metal layer M, includes oxide of the metal material of the metal layer M, and has nano structures of a complicated shape including pores V (e.g., see FIG. 6) therein. Therefore, the hydrophobic blocking layer 800 may have hydrophobicity. In addition, as described above, because the surfactant layer 900 (e.g., see FIG. 6) may be further formed on the hydrophobic blocking layer 800, the hydrophobicity of the hydrophobic blocking layer 800 may be enhanced even more, and the hydrophobic blocking layer 800 may more effectively block the moisture transmission due to the through portion H.

According to one or more example embodiments of the present disclosure, in the display apparatus, because the hydrophobic blocking layer is formed on the inner surface of the through portion in which a separate member such as a camera is arranged, a size or an area of the non-display area may be reduced, and the penetration of moisture, and/or the like due to the through portion may be blocked or substantially reduced.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display apparatus comprising:
a substrate comprising:
a display area comprising a plurality of thin film transistors, and a plurality of display elements electrically connected to the plurality of thin film transistors;
a first non-display area outside the display area; and
a second non-display area at least partially surrounded by the display area;
a through portion passing through the substrate in a vertical direction in the second non-display area;
a metal layer surrounding the through portion at the second non-display area; and
a hydrophobic blocking layer on an inner side surface of the through portion,
wherein the hydrophobic blocking layer comprises an oxide of a metal material of an exposed end of the metal layer at the inner side surface of the through portion.

2. The display apparatus of claim 1, wherein the hydrophobic blocking layer is integral with the metal layer.

3. The display apparatus of claim 1, wherein the metal layer comprises at least one of indium, zinc, gallium, zirconium, copper, or titanium.

4. The display apparatus of claim 1, wherein the substrate comprises a first base layer, a first barrier layer, a second base layer, and a second barrier layer that are sequentially stacked, and the hydrophobic blocking layer covers a lateral surface of the second base layer that is exposed through the through portion.

5. A display apparatus comprising:
a substrate comprising:
   a display area comprising a plurality of thin film transistors, and a plurality of display elements electrically connected to the plurality of thin film transistors;
   a first non-display area outside the display area; and
   a second non-display area at least partially surrounded by the display area;
a through portion passing through the substrate in a vertical direction in the second non-display area;
a metal layer surrounding the through portion at the second non-display area; and
a hydrophobic blocking layer on an inner side surface of the through portion,
wherein the hydrophobic blocking layer comprises an oxide of a metal material of the metal layer, and
wherein the hydrophobic blocking layer comprises a nano-structure comprising pores in an inside portion and a surface of the hydrophobic blocking layer.

6. The display apparatus of claim 5, further comprising a surfactant layer on the hydrophobic blocking layer,
wherein the surfactant layer comprises at least one of stearic acid, oleic acid, or fluorosilane.

7. The display apparatus of claim 6, wherein surfactants of the surfactant layer fill the pores.

8. The display apparatus of claim 1, further comprising an inner dam surrounding the through portion at the second non-display area,
wherein the metal layer is between the inner dam and the through portion.

9. The display apparatus of claim 8, further comprising an encapsulation layer on the plurality of display elements, and comprising a first inorganic encapsulation layer, an organic encapsulation layer, and a second inorganic encapsulation layer that are sequentially stacked,
wherein:
   the organic encapsulation layer is outside a region partitioned by the inner dam,
   the first inorganic encapsulation layer and the second inorganic encapsulation layer extend to the through portion and directly contact each other between the inner dam and the through portion, and
   the metal layer is on the second inorganic encapsulation layer.

10. The display apparatus of claim 1, wherein each of the plurality of display elements comprises a pixel electrode, an opposite electrode, and an intermediate layer,
wherein:
   the pixel electrode is on a planarization layer, the opposite electrode is over the pixel electrode, and the intermediate layer is between the pixel electrode and the opposite electrode,
   at least one layer of the intermediate layer and the opposite electrode extend to the second non-display area, and
   the hydrophobic blocking layer covers lateral surfaces of the at least one layer of the intermediate layer and the opposite electrode exposed by the through portion.

* * * * *